(12) United States Patent
Petrosillo

(10) Patent No.: US 10,050,162 B2
(45) Date of Patent: Aug. 14, 2018

(54) ARTIFICIAL TREE FOR GENERATING HYBRID ENERGY

(71) Applicants:Piero Petrosillo, Brindisi (IT); Stefano Leoci, Brindisi (IT)

(72) Inventor: Piero Petrosillo, Brindisi (IT)

(73) Assignee: Stefano Leoci, Brindisi (IT)

( * ) Notice: Subject to any disclaimer, the term of this patent is extended or adjusted under 35 U.S.C. 154(b) by 313 days.

(21) Appl. No.: 14/366,326

(22) PCT Filed: Dec. 27, 2012

(86) PCT No.: PCT/IB2012/057738
§ 371 (c)(1),
(2) Date: Jun. 18, 2014

(87) PCT Pub. No.: WO2013/098766
PCT Pub. Date: Jul. 4, 2013

(65) Prior Publication Data
US 2014/0305497 A1    Oct. 16, 2014

(30) Foreign Application Priority Data

Dec. 28, 2011 (IT) .............................. MI2011A2410

(51) Int. Cl.
*H01L 31/042* (2014.01)
*H02N 6/00* (2006.01)
(Continued)

(52) U.S. Cl.
CPC .......... *H01L 31/0422* (2013.01); *F03D 3/005* (2013.01); *F03D 9/007* (2013.01); *F03D 9/10* (2016.05); *F03D 9/11* (2016.05); *F03D 9/14* (2016.05); *F03D 9/25* (2016.05); *F03D 13/20* (2016.05); *H02S 10/12* (2014.12); *H02S 20/00* (2013.01); *Y02E 10/728* (2013.01); *Y02E 10/74* (2013.01); *Y02E 60/17* (2013.01)

(58) Field of Classification Search
CPC .......... H01L 31/0422; F03D 9/14; F03D 9/11; F03D 13/20; F03D 9/10; F03D 9/007; F03D 3/005; H02S 20/00; Y02E 60/17; Y02E 10/728; Y02E 10/74
See application file for complete search history.

(56) References Cited

U.S. PATENT DOCUMENTS 1,245,616 A * 11/1917 Pressler ................. F03D 9/001
417/35
4,200,904 A    4/1980 Doan
(Continued)

FOREIGN PATENT DOCUMENTS

EP         1024550 A1     8/2000
JP      2011-108549 A     6/2011
(Continued)

*Primary Examiner* — Angelo Trivisonno
(74) *Attorney, Agent, or Firm* — R. Ruschena Patent Agent, LLC

(57) ABSTRACT

An artificial tree for generating hybrid energy is described, having an elevated structure connected to and supported by a base structure integral with the ground (G). The base structure including a central modular trunk integral with the ground and formed by vertically superimposed tubular members joined to one another.

19 Claims, 12 Drawing Sheets

(51) Int. Cl.
*H02S 10/12* (2014.01)
*F03D 9/25* (2016.01)
*F03D 9/00* (2016.01)
*F03D 3/00* (2006.01)
*H02S 20/00* (2014.01)
*F03D 9/10* (2016.01)
*F03D 9/11* (2016.01)
*F03D 9/14* (2016.01)
*F03D 13/20* (2016.01)

(56) References Cited

U.S. PATENT DOCUMENTS

| | | | | |
|---|---|---|---|---|
| 5,779,051 A | * | 7/1998 | Boutin | B65D 21/0235 206/504 |
| 2003/0230333 A1 | * | 12/2003 | Kashyap | F03D 9/007 136/243 |
| 2010/0158673 A1 | | 6/2010 | Keene | |
| 2010/0289269 A1 | * | 11/2010 | Christy | F03D 9/007 290/55 |
| 2010/0314876 A1 | * | 12/2010 | Frayne | F03D 7/026 290/44 |
| 2011/0133466 A1 | * | 6/2011 | Kamenov | F03B 13/06 290/55 |
| 2011/0133474 A1 | * | 6/2011 | Haar | F03D 3/06 290/55 |
| 2011/0139215 A1 | | 6/2011 | Lyden | |

FOREIGN PATENT DOCUMENTS

| | | | |
|---|---|---|---|
| WO | 2010/098656 A2 | 9/2010 | |
| WO | WO 2010098656 A2 * | 9/2010 | ............... F03D 1/04 |

\* cited by examiner

ARTIFICIAL TREE FOR GENERATING HYBRID ENERGY

BACKGROUND OF THE INVENTION

1. Field of the Invention

The present invention relates to an artificial tree for generating hybrid energy, i.e. a renewable source energy generator being made with suitable shape and materials to respect the aesthetic, landscape and material compatibility needs typical of either natural or urban outdoor environments, in which there is the desire to produce and distribute energy to public or private users. In particular, this energy generator is suited to exploit renewable wind and photovoltaic technology energy sources in combined manner and to use cisterns and water pipes suited for suspended accumulation, purification and distribution of rainwater.

2. Brief Description of the Prior Art

Generally, the installation and use of an energy generator in urban and extra-urban areas necessarily requires to open a landscape compatibility survey procedure accompanied by: aerial photogrammetry with identification of the concerned building; detailed technical report containing landscape compatibility verification of the installation with regards to urban planning requirements on town council and higher levels and to local building regulations; photographic documentation, drawings and description of the surrounding area, with historical-critical environmental report highlighting significant presences in environmental perspective to allow to evaluate the impact of the suggested intervention on the landscape; declaration of conformity of the building types and of the materials used with respect to those required and authorized by landscape planning measures.

Given landscape constraints regulated in the aforesaid manner, an energy generator with ascertained or easily ascertainable landscape compatibility is a topic of interest in the prior art relating to renewable source energy generators. US-201 01 58673 describes a vertical axis wind turbine connected to a central shaft for generating electricity of the type inserted and concealed in an ornamental structure which reproduces and imitates the branches of a natural tree.

US-2011139215 describes an energy production module for industrial, residential and transportation use of the hybrid type inserted in a structure having the shape of a natural tree. In particular, US-2011139215 describes a solar cell module network communicating with recharging stations of hybrid vehicles distributed in an urban fabric.

GB-2374122 describes a vertical axis wind turbine for generating electricity inserted in a natural tree shape.

A small/medium-sized energy generator is generally arranged at a vertical height compatible with the height of the adjacent natural trees. This implies a problem in reaching and maintaining an energy efficiency target, above all for wind blades in presence of a highly variable wind speed gradient, typical of flat and hilly urban and extra-urban areas and in presence of obstacles. This problem relates to adapting to spectral power density, above all of the wind type, but the same also applies to a solar energy gradient in presence of obstacles, above all in urban areas, which hinders the dissemination and the use of hybrid energy generators of landscape-compatible shape and size, which are therefore susceptible to energy efficiency reducing wind speed and solar energy gradients.

KR-20100048534 describes a wind turbine wherein a magnetic force increases energy generation efficiency. A wind energy generator comprises a rotating part and a fixed part integral with a magnet system pushing a magnetic part rotating by means of magnetic repelling force.

JP-2003 139041 describes an energy generator of the wind type operating with a low wind flow by virtue of the use of fixed and mobile magnets subjected to a repelling magnetic force.

US-201010289269 describes an artificial tree for the generation of electricity by exploiting solar and wind energy.

WO-20101098656 describes an apparatus for generating electricity from solar and wind sources additionally comprising a rainwater collection tank.

It is the object of the present invention to make an artificial tree for generating hybrid energy compatible with the landscape and aesthetic constraints of a given urban or extra-urban area.

SUMMARY OF THE INVENTION

A further object of the present invention is to make a medium/small-size artificial tree for generating hybrid energy capable of working according to an optimal power curve within a wide range speed rate distribution.

A yet further object of the present invention is to make an artificial tree for generating hybrid energy which is easily transportable and installable anywhere. In accordance with the invention, such objects are reached by an artificial tree as disclosed in claim 1.

BRIEF DESCRIPTION OF THE DRAWINGS

The present invention will be described in greater detail by some preferred embodiments provided by way of non-limitative example with reference to the accompanying drawings, in which.

DETAILED DESCRIPTION OF THE PREFERRED EMBODIMENTS

Figure 1:
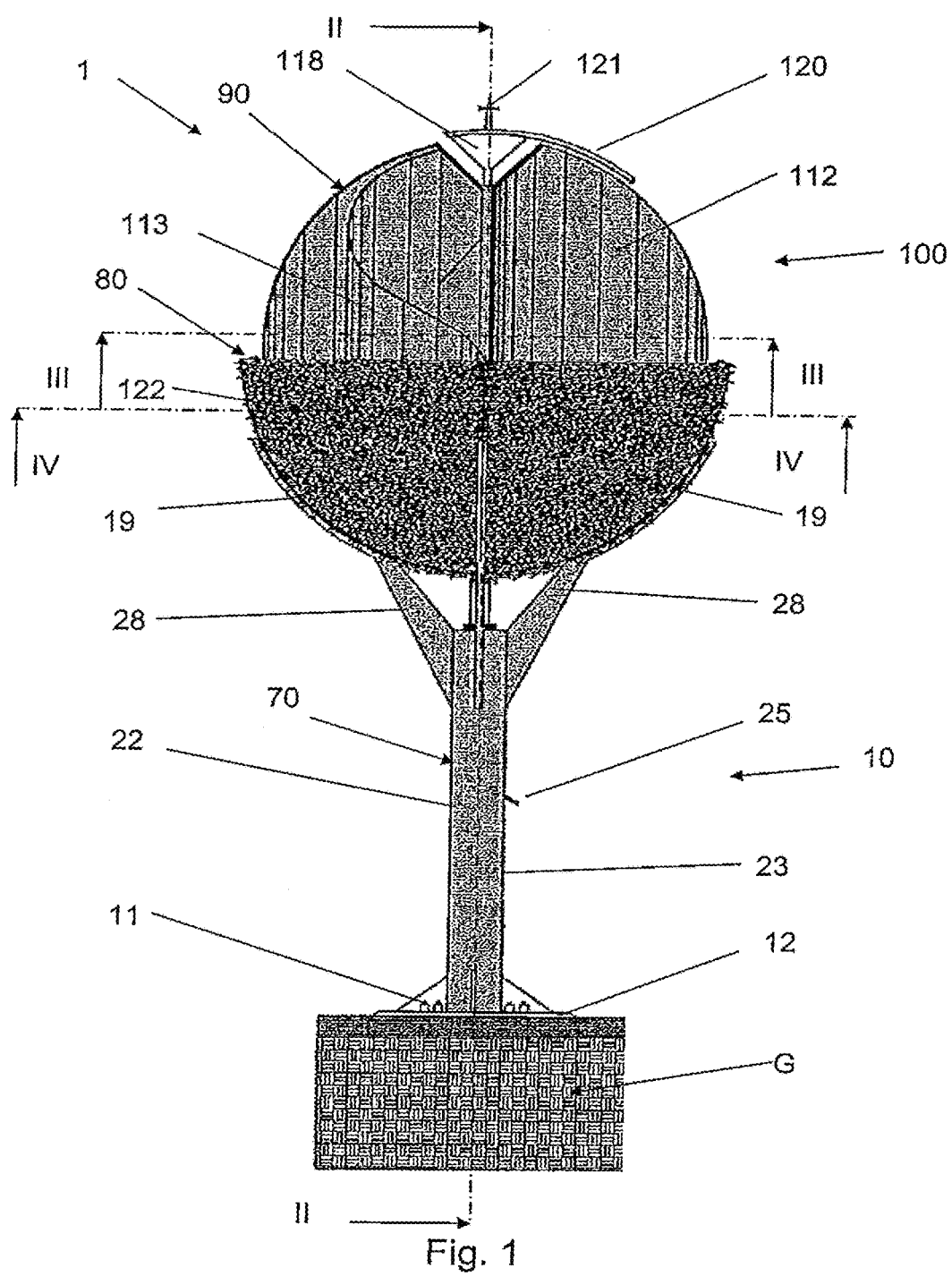
FIG. 1 shows a front view of an artificial tree according to a first embodiment of the invention.

With particular reference to FIGS. 1-5, a first type of artificial tree 1 for generating hybrid energy comprises an elevated structure 100 connected to and supported by a base structure 10 integral with reinforced concrete foundations F, made
in the ground G, by means of a plate 12 provided with steel threaded anchor bolts 11.

The base structure 10 comprises a modular central trunk 70 formed by superimposed tubular members 13-16, e.g. made of galvanized iron, the flanged and pierced ends of which are joined by means of corrosion resistant bolts.

The number of tubular members 13-16 to be superimposed depends on the desired total height of the tree 1.

The modularity of the central trunk 70 allows easy transportability of the component members 13-16 during assembly anywhere.

Four radially protruding profiles 18 provided with holes are fixed to the tubular member 15 and coupled by means of bolts to the respective pierced ends of four equally distanced and radially protruding shelves 19, e.g. also made of galvanized steel.

The connection between the central trunk 70 and the shelves 19 constitutes a rigid load-bearing structure further stabilized by means of a hoop consisting of a galvanized iron ring 20 connecting the protruding ends of the shelves 19, and a ring 21 connecting the middle line of each shelf 19.

Said central trunk 70 is lined by a laminated wood covering, formed by two half shells 22, 23. A series of laminated wood ribs 28 radially protrude from the upper end of the covering 22, 23. An artificial foliage covering reinforced with mesh 122 covers the cap shape formed by the shelves 19.

A PVC water pipe 24 is provided in the compartment obtained within said covering 22, 23 and connected to the user by means of a water dispenser 25, and a control unit 26 connected by means of electric wires 27 which run along the inner cavity of the central trunk 70.

Said shelves 19 support a water reserve cistern 80 split into four tanks 101-1-04, e.g. made of plastic, shaped at the bottom to be fixed to said shelves 19 and defining a peripheral edge 81 at the top.

Said tanks 101-104 are centrally shaped so as to join and form a fluid-tight cylindrical compartment 130, which is free from water.

A casing 105 is accommodated in said compartment 130, the casing 105 being pierced in the center to allow fitting along the tubular member 16, in which an array of electric batteries 106 and a water purifier 107 are accommodated inside the casing 105.

A box 108, also pierced in the center to allow fitting along the tubular member 16, is placed along the casing 105. An electric apparatus comprising, in particular, an electricity generator 109, a charge regulator 110 and an inverter 111, is accommodated in the box 108. An inner crown 117, provided with a series of magnets equally distributed about the inner circumference, is integral with the stator member of the electric generator contained in the box 108.

A radial flow wind turbine 90 is formed by blades 112, 113 and 114, e.g. made of fiberglass, carbon or aluminum, converging towards the center according to a spiral and connected by means of a central shaft 115 rotatably associated with a superimposed tubular member 17 fixed to said member 16 accommodated in said compartment 130, by means of a pair of ball bearings. A rotating crown 1-16 integral with the hollow shaft 115 is provided with a series of magnets equally distributed along the outer circumference.

The coaxial coupling of the rotating crown 116 with the stator crown 117 forms a
magnetic motor formed by repelling magnetic poles.

Figure 12:
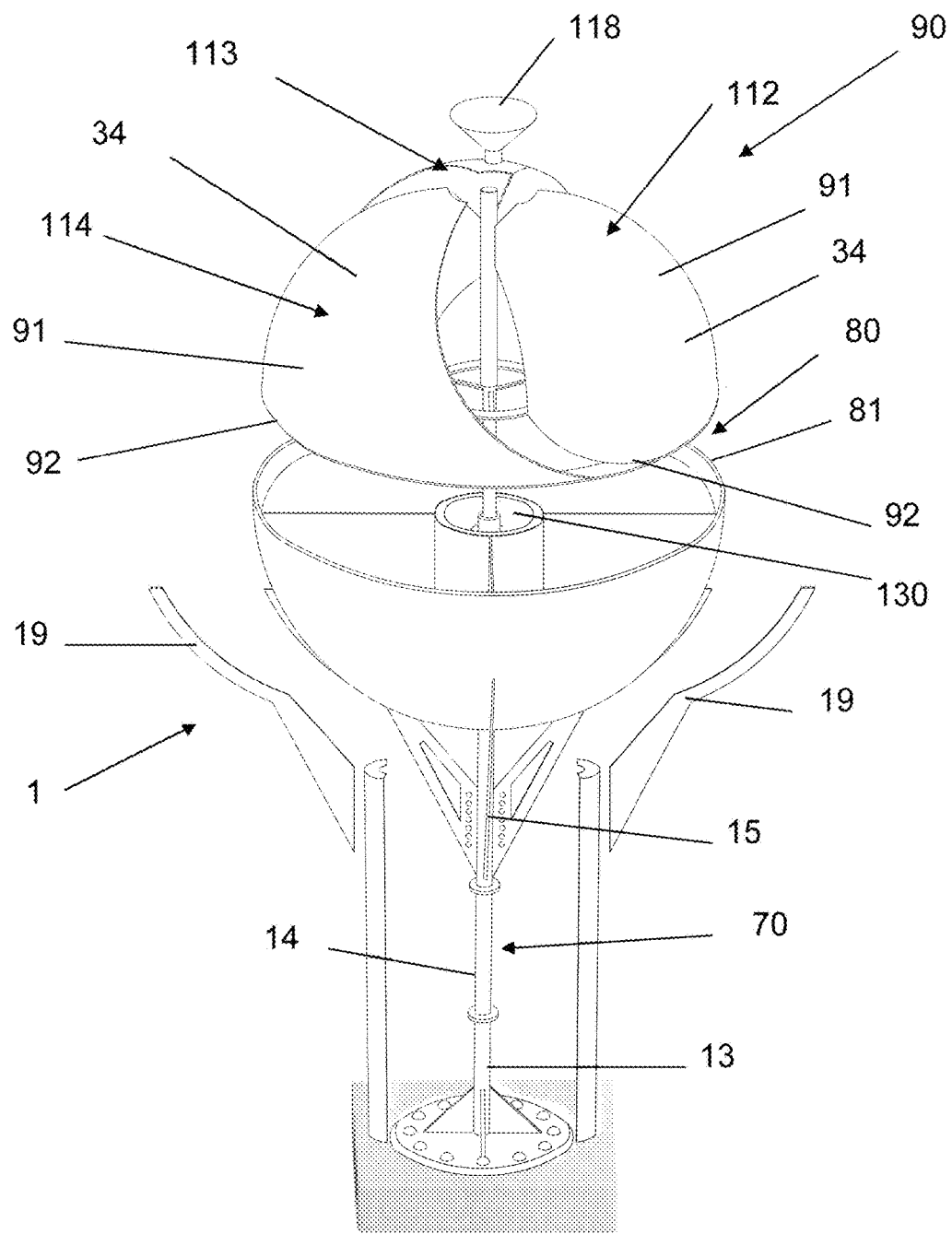
FIG. 12 shows an exploded view of the tree in FIG. 1 provided with photovoltaic members fixed to wind blades.

With particular reference to FIG. 12, each blade 112-114 has an outer convex curved surface 9-1, which joins at the bottom with the other blades 114, 113, 112 forming a single lower edge 92 of the wind turbine 90. Said blades 112-114 are fixed to said central shaft 115 to actuate the rotation thereof.

Said curved surface 91 expands radially from the top downwards so that after assembly said lower edge 92 remains within the edge 81 of the cistern 80. Consequently, rainwater can easily slide along the curved surfaces 91 and advantageously end up inside the cistern 80.

The surfaces 91 support photovoltaic members 34 which follow the curve of said e.g. made of plastic, shaped at the bottom to be fixed to said shelves 19 and defining a peripheral edge 81 at the top.

Said tanks 101-104 are centrally shaped so as to join and form a fluid-tight cylindrical compartment 130, which is free from water.

A casing 105 is accommodated in said compartment 130, the casing 105 being pierced in the center to allow fitting along the tubular member 16, in which an array of electric batteries 106 and a water purifier 107 are accommodated inside the casing 105.

A box 108, also pierced in the center to allow fitting along the tubular member 16, is placed along the casing 105. An electric apparatus comprising, in particular, an electricity generator 109, a charge regulator 110 and an inverter 111, is accommodated in the box 108. An inner crown 117, provided with a series of magnets equally distributed about the inner circumference, is integral with the stator member of the electric generator contained in the box 108.

A radial flow wind turbine 90 is formed by blades 112, 113 and 114, e.g. made of fiberglass, carbon or aluminum, converging towards the center according to a spiral and connected by means of a central shaft 115 rotatably associated with a superimposed tubular member 17 fixed to said member 16 accommodated in said compartment 130, by means of a pair of ball bearings. A rotating crown 1-16 integral with the hollow shaft 115 is provided with a series of magnets equally distributed along the outer circumference.

The coaxial coupling of the rotating crown 116 with the stator crown 117 forms a
magnetic motor formed by repelling magnetic poles.

With particular reference to FIG. 12, each blade 112-114 has an outer convex curved surface 9-1, which joins at the bottom with the other blades 114, 113, 112 forming a single lower edge 92 of the wind turbine 90. Said blades 112-114 are fixed to said central shaft 115 to actuate the rotation thereof.

Said curved surface 91 expands radially from the top downwards so that after assembly said lower edge 92 remains within the edge 81 of the cistern 80. Consequently, rainwater can easily slide along the curved surfaces 91 and advantageously end up inside the cistern 80.

Figure 13:
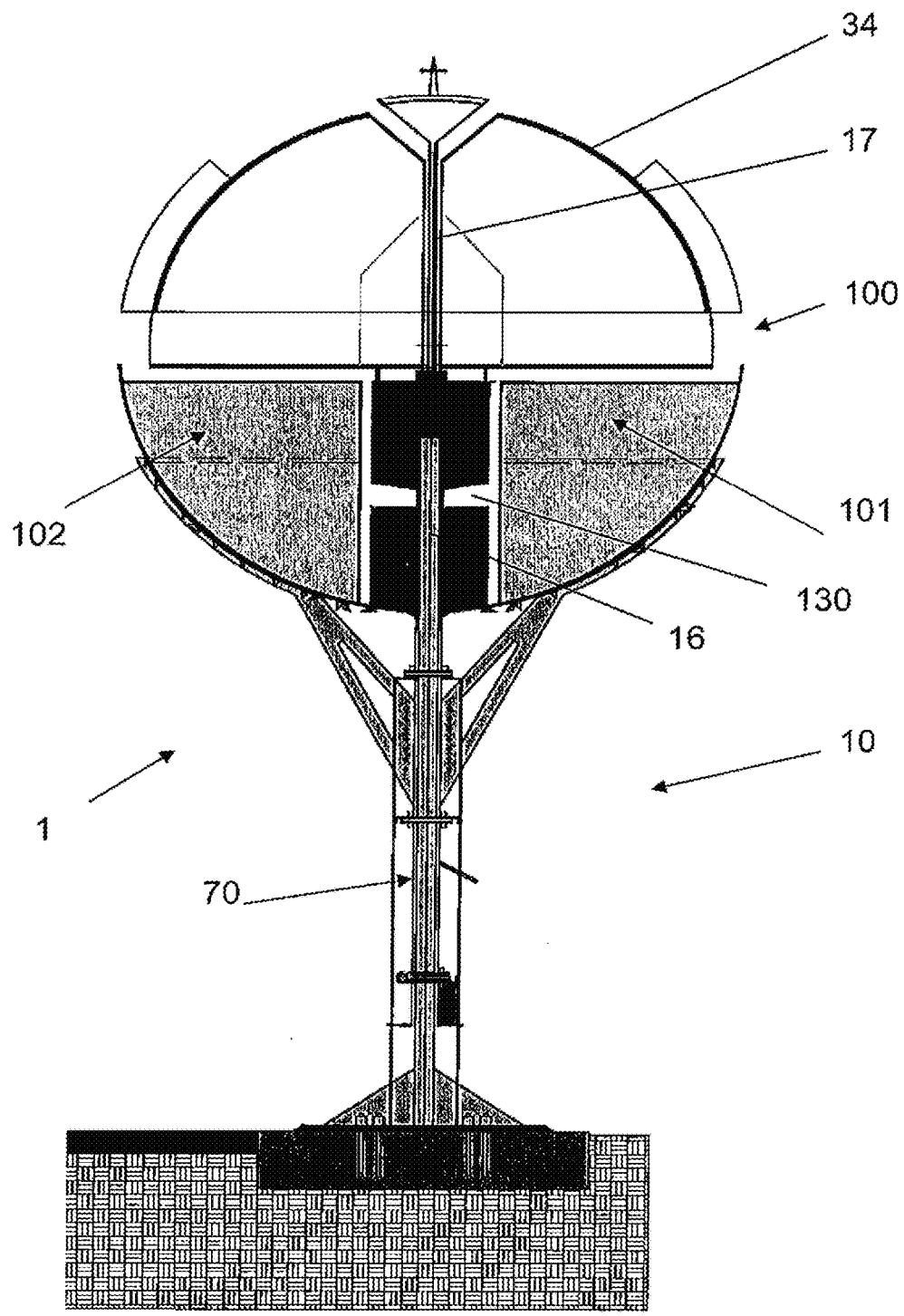
FIG. 13 shows a partial vertical section view of the tree in FIG. 12.

The surfaces 91 support photovoltaic members 34 which follow the curve of said surfaces 91 and rotate therewith (FIGS. 12 and 13). Said members 34 comprise a photovoltaic surface, which may be either rigid or made of fabric (multicolor foliage effect). Advantageously, the entire photovoltaic solar radiation collecting surface can be exploited (thus not only that exposed south, south-east and south-west).

A water receptor 1-18 is fitted on the end of the tubular member 17 by means of a bearing 119.

Figure 2:
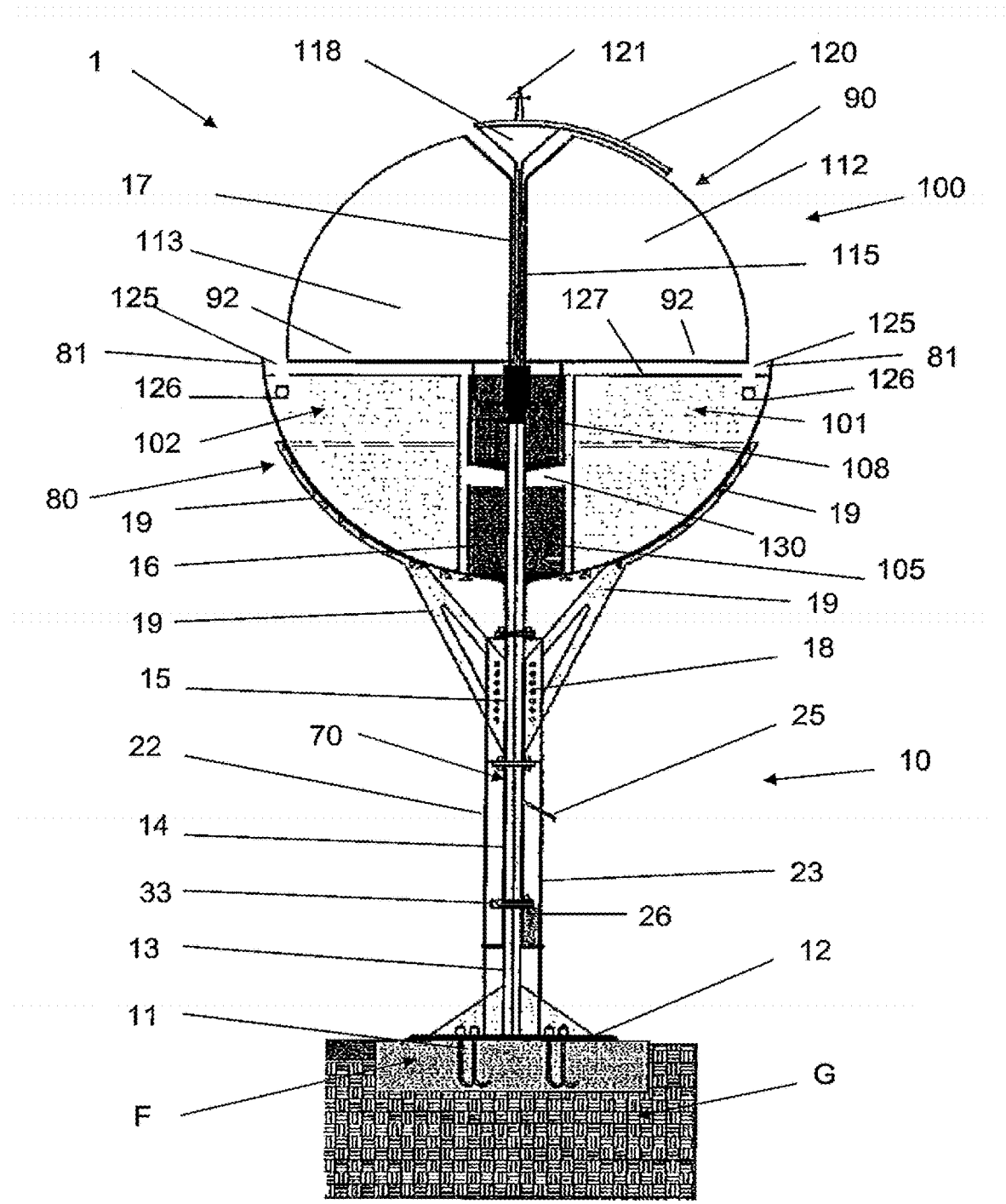
FIG. 2 shows a section view taken along line 11-11 in FIG. 1-.
Figure 3:
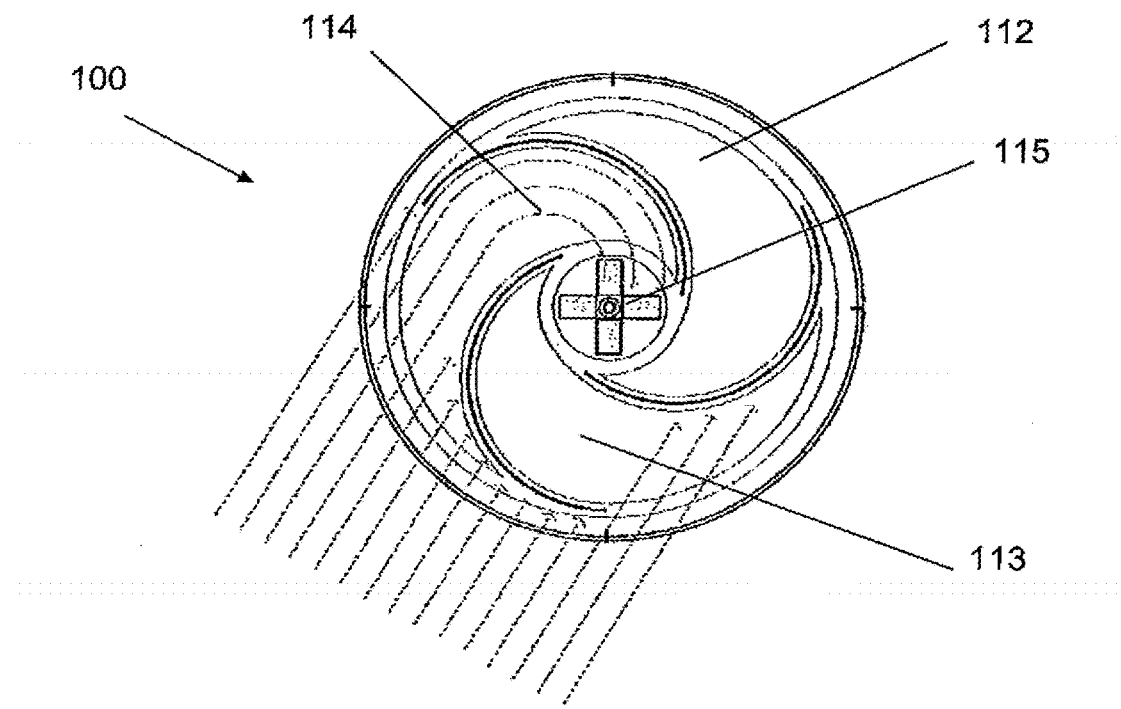
FIG. 3 shows a section view taken along line 111-111 in FIG. 1-.
Figure 4:
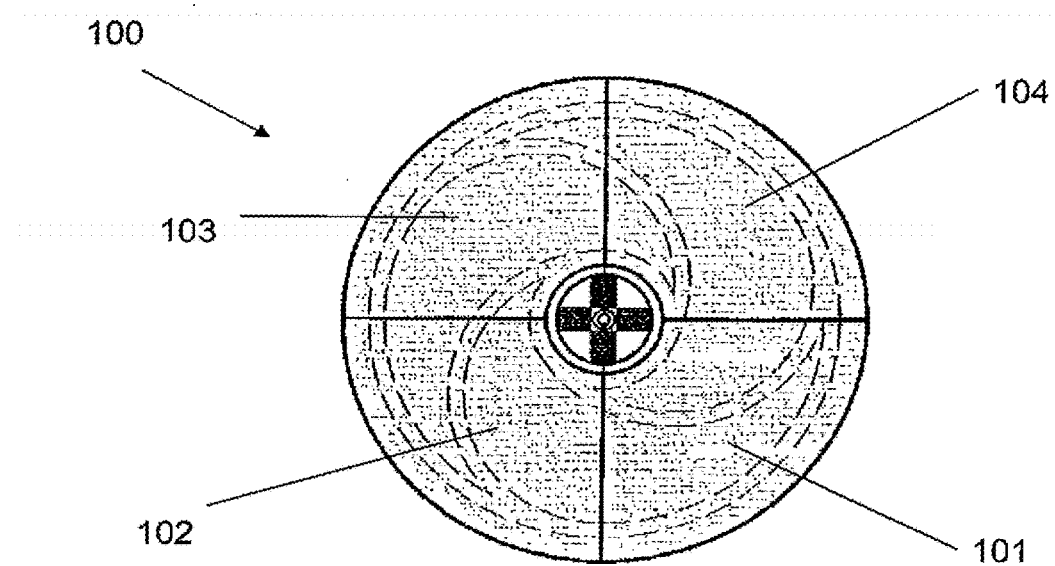
FIG. 4 shows a section view taken along line IV-IV in FIG. 1-.
Figure 5:
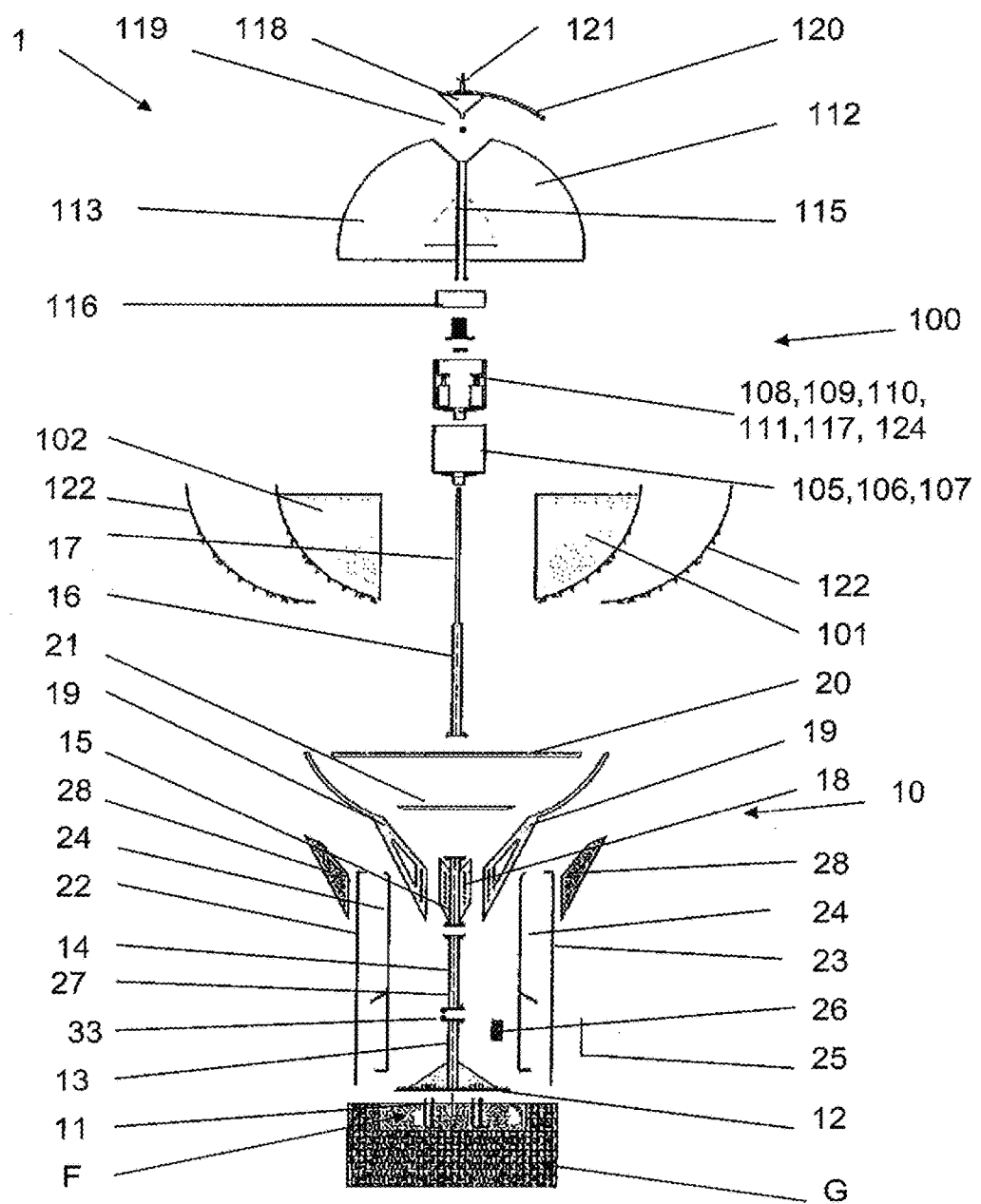
FIG. 5 shows an exploded view of the tree in FIG. 1.
Figure 6:
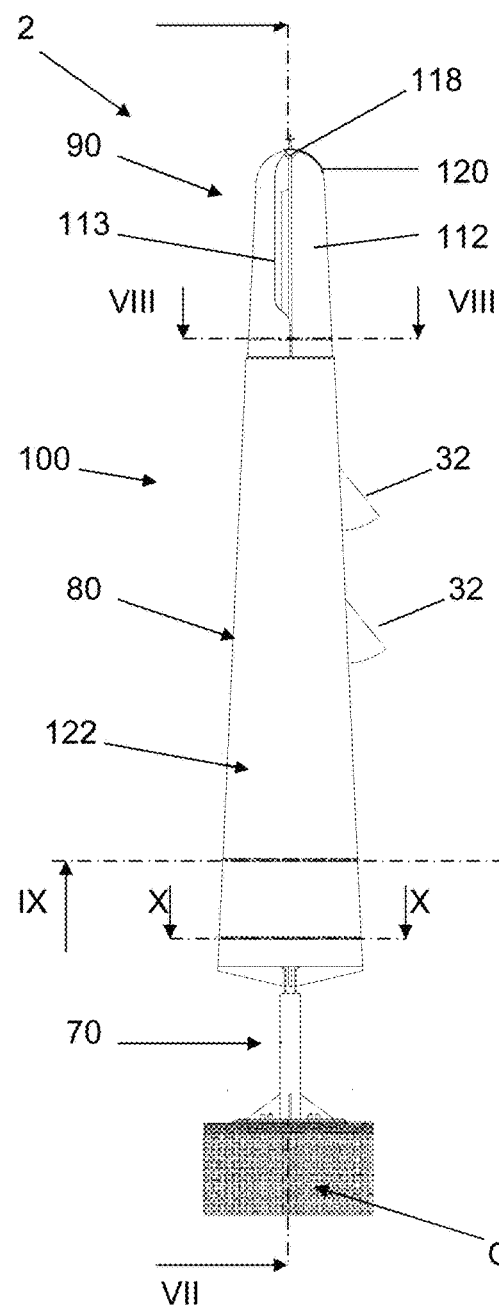
FIG. 6 shows a front view of an artificial tree according to a second embodiment of the invention.

A photovoltaic cap 120 is integral with the water receptor 118 (FIG. 2).

An anemometer 121 is superimposed over the integral hybrid energy generator integral to the artificial tree 1.

The wind turbine 90 may be covered by a snow cap.

The artificial tree 1 thus includes a wind turbine 90 with a large cap split into three panels (with spiral-shaped radii, i.e. the blades 112-114), each of which may be made, for example, of fiberglass and/or carbon and/or aluminum and/or nylon, with a cap sector upper surface having a semicircular and/or elliptical profile on which a photovoltaic lining 34 is integrated (FIG. 14), which is struck by the wind in radial direction. The cap shape allows to develop a large photovoltaic collecting surface integrated with the wind blade, which is entirely struck by solar radiations (and thus not only the part facing south, south-east or south-west) by virtue of the instantaneous rotary movement of the blade itself. The synergic action between wind system and integrated photovoltaic system allows to double the reacting surface, and consequently also the produced photovoltaic energy.

Figure 14:
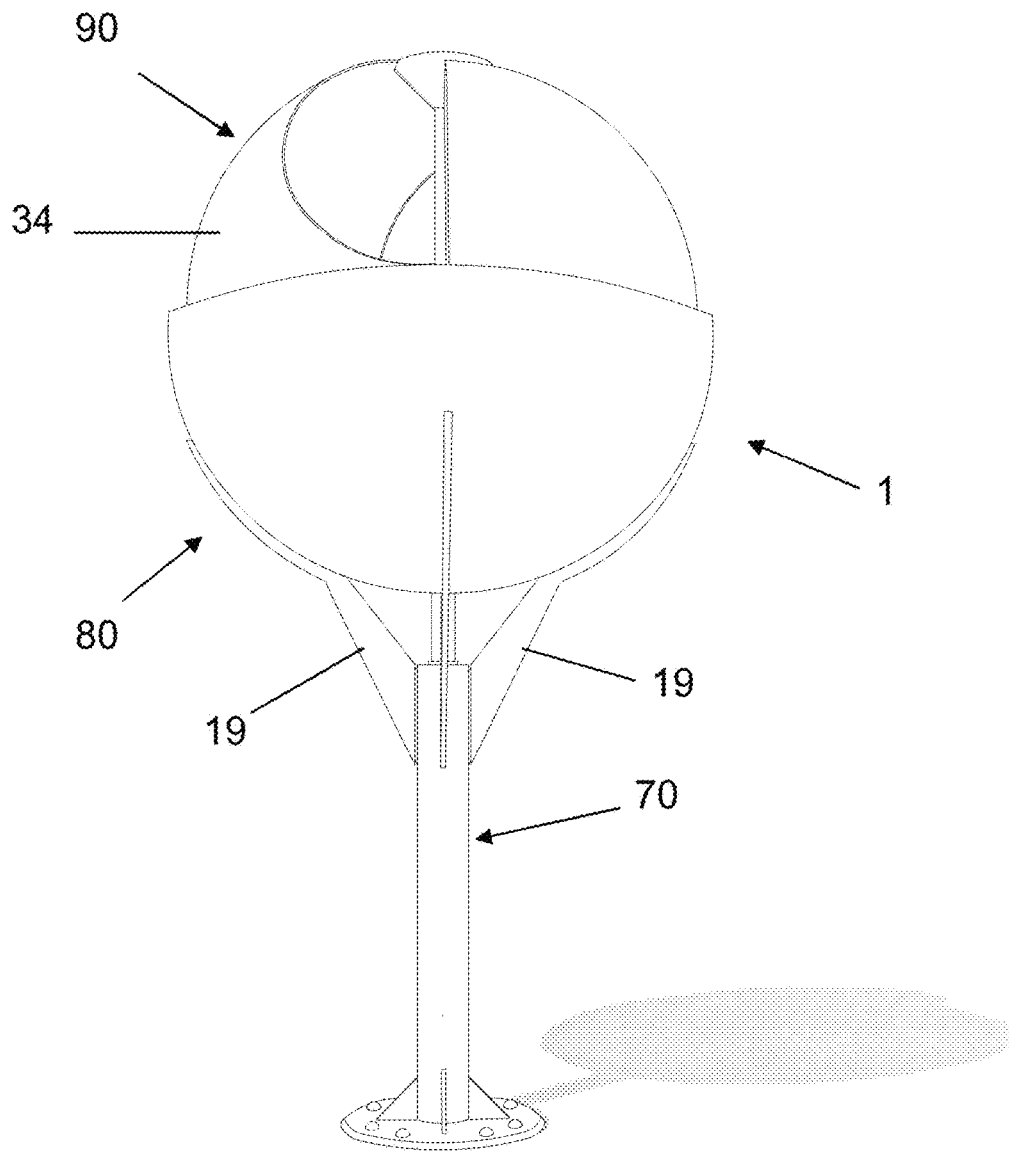
FIG. 14 shows a front view of the artificial tree in FIG. 1 with a photovoltaic member integrated in the wind blades.
Figure 15:
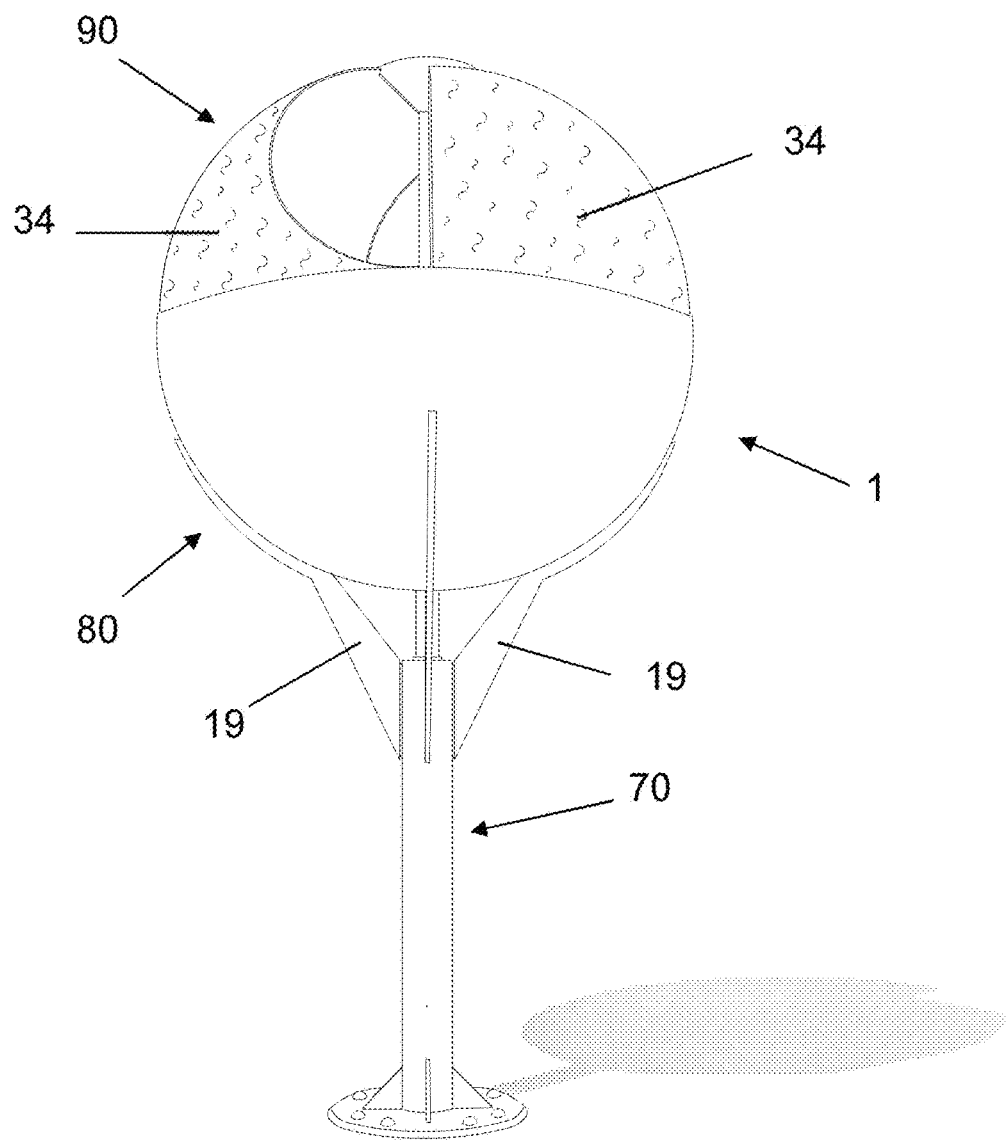
FIG. 15 shows a front view of the artificial tree in FIG. 1 with photovoltaic foliage integrated in the wind blades.

Alternatively (FIG. 15), the photovoltaic member 34 may consist of a lining made of artificial plastic foliage and/or artificial photovoltaic fabric foliage, to replace the photovoltaic surface shown in FIG. 14, which is struck by the wind in radial direction.

The curvilinear profile cap shape of the wind turbine 90 has the function of synergistically allowing to expand the available photovoltaic surface (integrated with the blades 112-114), and consequently also the surface for intercepting of a large amount of rainwater, which slides on the surface and is conveyed by gravity. Subsequently, the rainwater is stored in the cistern 80, possibly also by means of large water receptors 125 (FIG. 2) arranged in circular manner, consisting of a circular opening on the lid 127 of the cistern 80, near the edge 81. The water receptors 125 are closed by specific mechanisms connected to overflow floats 126 positioned inside the cisterns 80, when the cisterns 80 are full.

The cistern 80 is cap-shaped with a curvilinear profile converging downward towards the center so as to allow the collected rainwater to be conveyed by gravity towards the water purifier 107 and the water distribution pipes 24 positioned at the central trunk 70.

A second embodiment of an artificial tree 2 according to the invention is described with reference to figures from 6 to 11.

Deliberately using the same numeric references as the first artificial tree 1, the second artificial tree 2 substantially comprises all the parts of the tree 1.

Tree 2 differs from tree 1 for its elongated upward shape simulating that of a cypress tree.

From a structural point of view, said difference of shape implies a different construction of the cistern 80, which is formed by various layers of stacked tanks 101-104 of overall truncated cone shape (with cylindrical hole 105 in the center) and tapering upwards.

Figure 7:
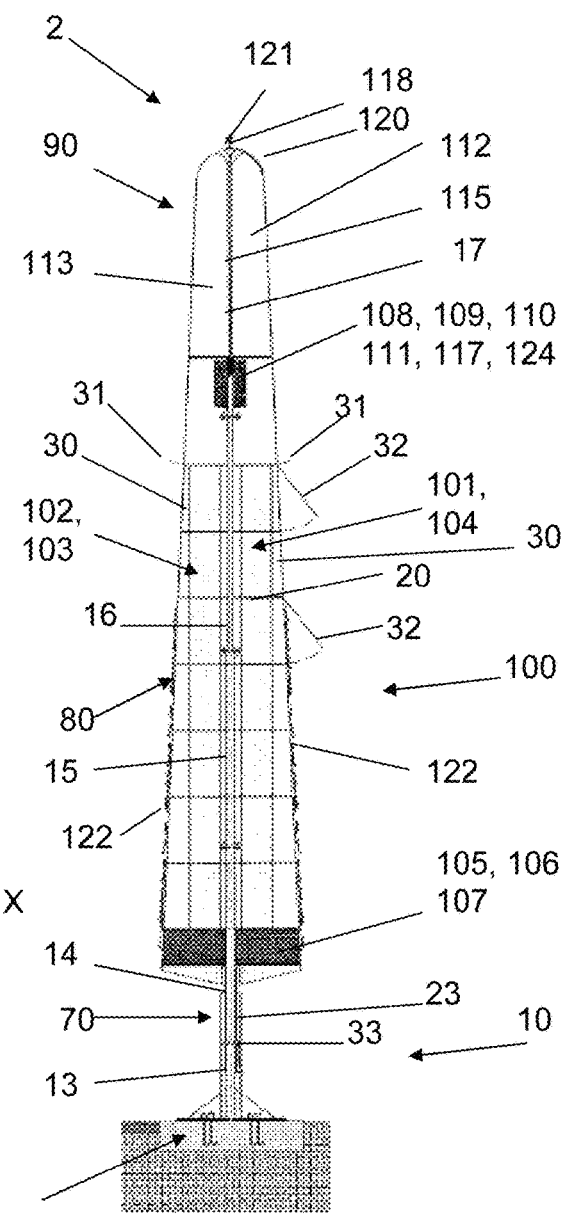
FIG. 7 shows a section view taken along line VII-VII in FIG. 6.
Figure 8:
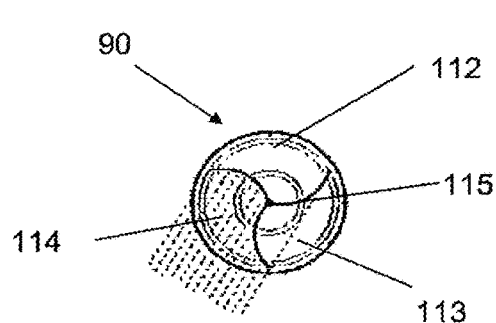
FIG. 8 shows a section view taken along line VIII-VIII in FIG. 6.
Figure 10:
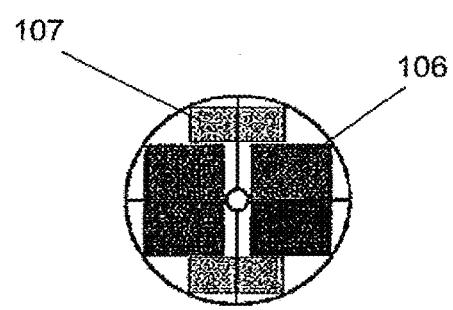
FIG. 10 is a section view taken along line X-X in FIG. 6.
Figure 9:
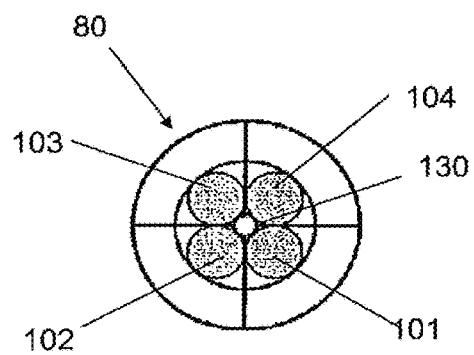
FIG. 9 shows a section view taken along line IX-IX in FIG. 6.
Figure 11:
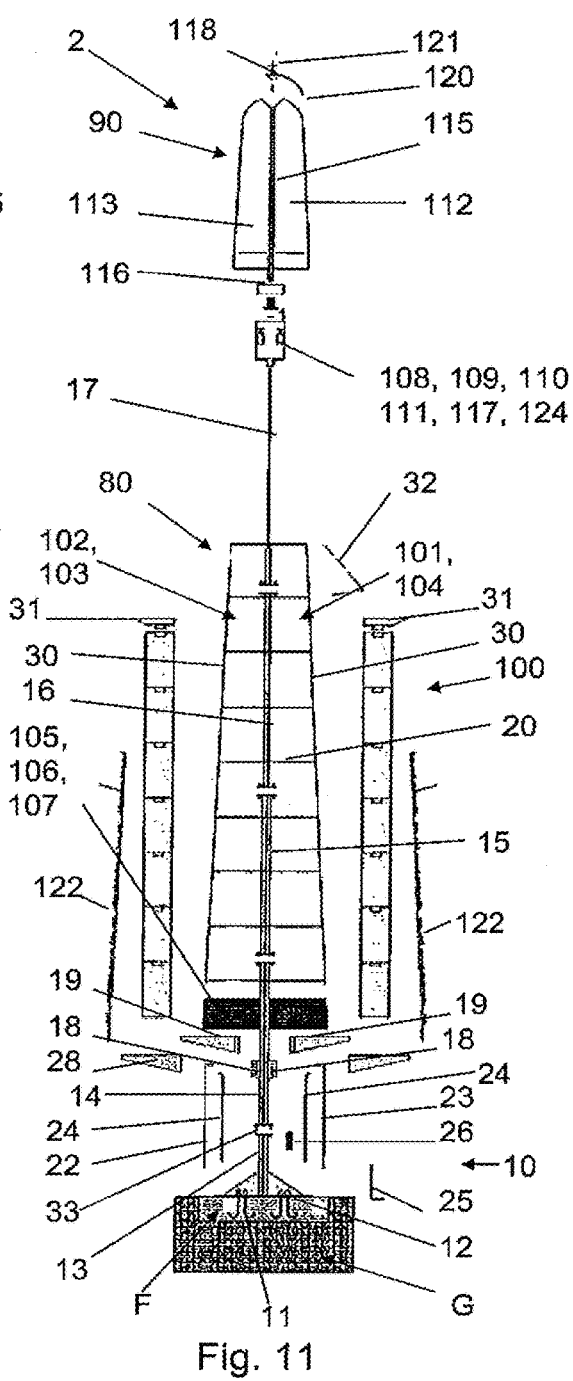
FIG. 11 is an exploded view of FIG. 6.

A double modularity of the cistern 80 is thus made: a horizontal modularity of the cistern 80, with four tanks 101-104 arranged side-by-side about the central trunk 70; and a vertical modularity of the cistern 80, with a plurality of tank layers 101-104 with radial dimensions which taper upwards towards the top of the tree 2 (FIGS. 7 and 11).

Unlike tree 1, tree 2 includes the casing 105, pierced in the center, to allow fitting along the tubular member 14, underneath the tanks 101-104. The array of electric batteries 106 and the water purifier 107 are accommodated in all cases in the casing 105.

Furthermore, the box 108 is pierced in the center to allow to fit the tubular member 17 over the cistern 80.

Consequently, the compartment 130 is only used to define a space for coupling with the central trunk 70.

The tree 2 further includes additional water receptors 31 arranged on the head of the cistern 80 forming a rainwater collection ring.

Figure 16:
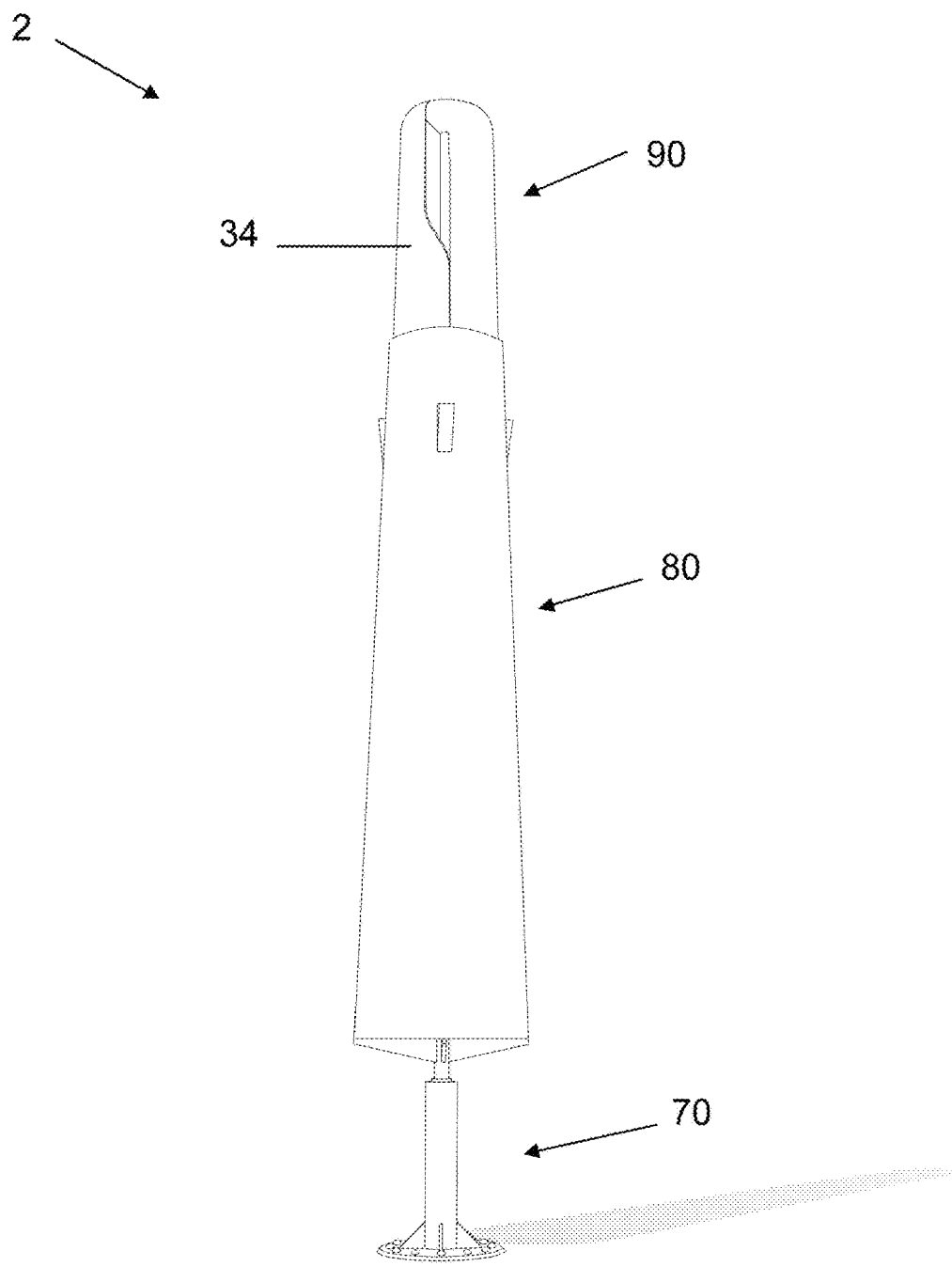
FIG. 16 shows a front view of the artificial tree in FIG. 6 with a photovoltaic member integrated in the wind blades.
Figure 17:
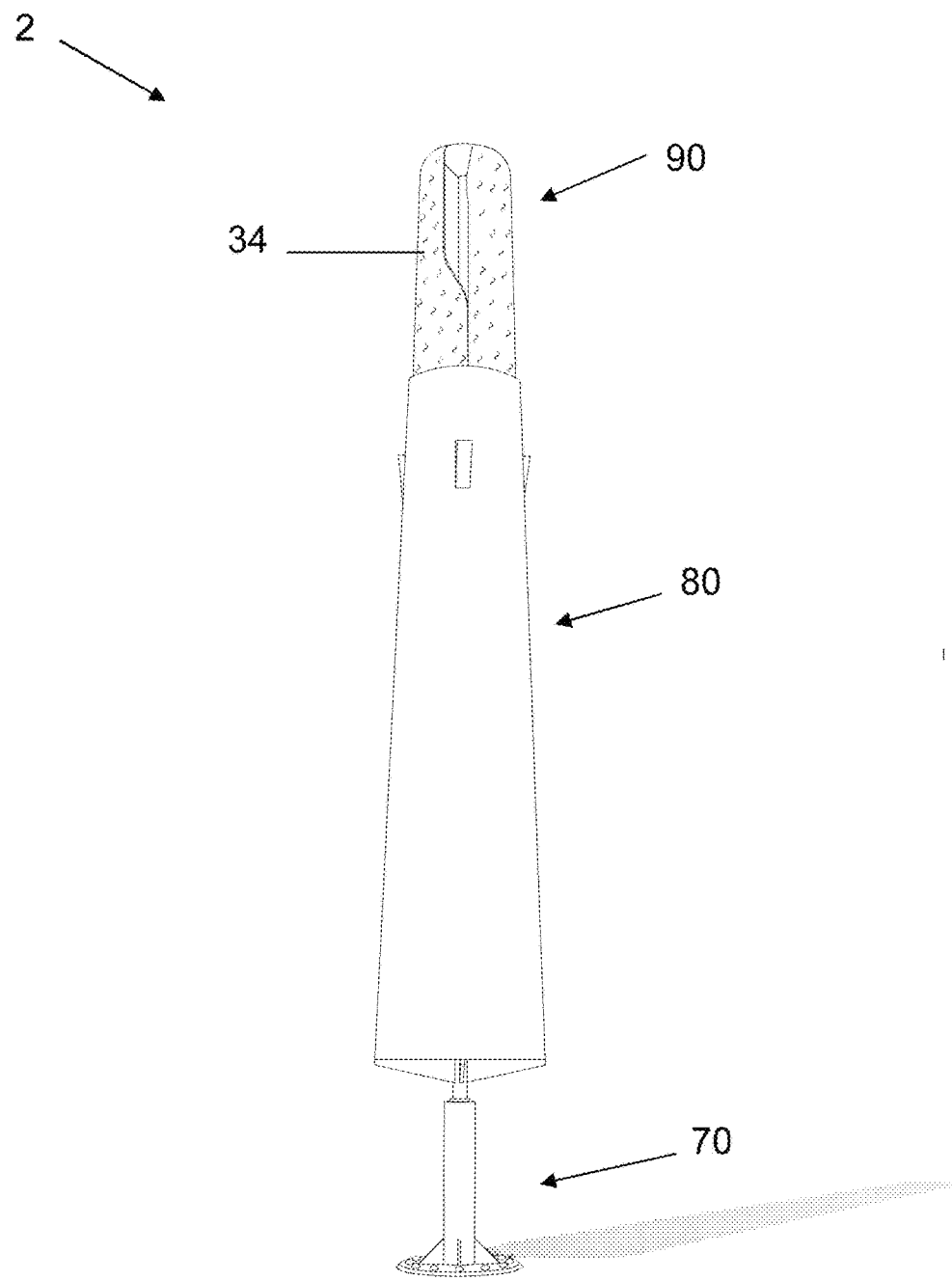
FIG. 17 shows a front view of the artificial tree in FIG. 6 with photovoltaic member and photovoltaic foliage integrated in the wind blades.

Further photovoltaic surfaces 32 are provided on the vertical crown of the tree, possibly also made of artificial plastic foliage and/or artificial foliage made of photovoltaic fabric (FIGS. 16, 17).

The space occupied by the water reserve cistern 80 is delimited by stabilizing loops 20, made of galvanized iron, distributed with regular pitch on surfaces horizontal to the vertical central axis of the artificial tree 2 and vertically connected by means of steel cables 30.

The energy power of the hybrid energy generator integral with the artificial tree 1, 2 covers a range from a few kilowatts to half a megawatt.

The height of the trees themselves may vary according to the developed energy power and the type of surroundings in which they will be installed.

The artificial tree 1, 2 includes combined wind and photovoltaic technologies compatible with landscape constraints.

The combination of the magnetic motor integrated with the wind system allows a minimum rotation sufficient to generate energy from renewable sources, solving the problem of operation in presence of weak or disturbed wind speed gradient. The hybrid operation allows the combined exploitation of the energy resources responding to the need for self-sufficiency in non-urbanized areas which are not connected to the power and water mains, such as desert or low rainfall areas and mountains, farming areas and suburban areas.

The tree 1, 2 allows to produce energy from renewable wind, magnetic and photovoltaic sources along with the possibility of suspended water accumulation which is not invasive in terms of landscape impact and transformation. Additionally, the structure can be moved and decommissioned. The rainwater collected during rainfall is stored in the cistern, purified and then used for drinking by animals and humans, for hygienic use and for irrigation in areas of the planet in which it is not possible to connect to the conventional water mains or where frequent droughts do not allow to grow crops.

The entire structure is formed by modular members made of recyclable material which are easy to assemble allowing use in remote areas which are difficult to reach.

Installation is facilitated by the presence of hinges 33 (tree 1 and 2) at the tubular members 13-17 which allow to vertically tip the structure assembled on the ground
during assembly without the aid of large-sized cranes to be transported to the installation site simply by exploiting the lifting apparatuses or pulleys equipping the means of transport used to reach the site.

By virtue of this system, the vertical structures can be arranged on the ground for periodical maintenance.

Advantageously, the artificial tree 1, 2 according to the present invention allows to
- provide primary resources, such as energy (for heating, lighting or other) and water (also purified), essential for human, animal and plant survival, in places which are not connected to the water or electric mains or to exploit sustainable energy and water exploitation in urbanized areas already provided with the mentioned connections.

The artificial tree 1, 2 incorporates several renewable wind, photovoltaic and water source technology mechanisms which work synergistically within and guarantee, at the same time, the possibility of storing large amounts of water and producing and storing large amounts of clean energy proportionally to the size of the component members, in environments in which rainfall is low or where unfavorable climatic conditions, such as low/no wind speed (when the wind blade rotation is started up and during rotation of the same) or the low/no solar radiation, do not allow optimal, constant exploitation of the conventional wind and photovoltaic systems, which are anyway not provided with high-capacity water collection cisterns.

Advantageously, the base structure consists of several modular modules and a hinge which simplify installation and disassembly also in places which are difficult to reach with large trucks.

The artificial tree 1, 2 may include an electric motor for starting the rotation of the blades in presence of low or no wind intensity or for assisting the rotation of the blades in presence of low wind intensity. The motor is managed by the control unit and supplied by the energy accumulated in the array of electric batteries produced, in turn, by the photovoltaic system integrated in the wind blades.

The synergetic action of the conventional wind system, of the magnetic motor system 117 integrated with the blades 112-114 (which allows to increase the rotation of the blades also in presence of low intensity wind), of the electric motor system 124 (for starting up/assisting the rotation in presence of low and/or no wind speed) and of the photovoltaic system 34 integrated with the wind blades 112-114 and/or with the artificial photovoltaic fabric foliage, allows a higher overall renewable source energy production also in presence of low wind intensity (due to various factors), because the single energy productions obtained by the photovoltaic system, by the large collecting surface integrated with the wind blade and/or with the artificial foliage and by wind system assisted by the magnetic motor and the electric motor can be added up.

The artificial. tree 1, 2 according to the present invention may include LED illuminating members supplied by the electric generator of the tree 1, 2 itself.

The invention claimed is:

1. An artificial tree for generating hybrid energy using renewable wind, photovoltaic energy technology and water storage, said artificial tree comprises an elevated structure connected to and supported by a base structure integral with the ground,
   wherein said base structure comprises a modular central trunk integral with the ground formed by vertically superimposed a variable number of tubular members joined to one another, achieve a central trunk of a desired total height;
   a casing additionally being provided and pierced in the center to allow coupling to one of said vertically superimposed tubular members, in which an array of electric batteries and a water purifier are housed, and a box, also pierced in the center to allow coupling to one of said superimposed tubular members, in which an electricity generator of magnetic type, a charge regulator and an inverter are accommodated,
   said modular central trunk being closed by two half shells in which a water pipe connecting said water reserve cistern to an external user, and a control unit with electric wires are provided,
   said elevated structure further comprising a radial flow wind turbine formed by blades converging towards the center according to a spiral and connected by means of a central shaft rotatably associated to a further superimposed tubular members and fixed to one of said vertically superimposed tubular members of the modular central trunk, each blade of said wind turbine includes a convex curved outer surface which is joined at the bottom to other blades forming a single lower edge, said blades being fixed to said central shaft actuating the rotation thereof,
   said convex curved outer surfaces radially expanding from the top downwards so that, after assembly, said single lower edge remains within the peripheral edge of the water reserve cistern providing the flowing of rainwater into the water reserve cistern,
   said convex curved outer surfaces of each blade of the wind turbine are radially expanding from the top downward and are supporting photovoltaic members which follow the curve of said convex curved outer surfaces, and turn therewith.

2. The artificial tree according to claim 1, wherein said tanks are centrally shaped so as to form by joining a fluid-tight cylindrical compartment, free from water, in which the casing and the box are accommodated.

3. The artificial tree according to claim 1, wherein said water reserve cistern is formed by a plurality of layers of tanks making a horizontal modularity of the water reserve cistern with the tanks arranged side-by-side about the modular central trunk, and a vertical modularity of the water reserve cistern with the stacking of said layers of tanks; and wherein said tanks have a truncated cone shape, with a cylindrical hole in the center, and tapering upwards with radial dimensions which taper upwards towards the top of the tree.

4. The artificial tree according to claim 1, wherein the artificial tree includes an electric motor for starting up the rotation of the blades in presence of low or no wind intensity and for assisting the rotation of the blades in presence of low wind intensity, said motor being managed by the control unit and being supplied by the energy accumulated by the array of electric batteries produced, in turn, by the photovoltaic members integrated in the blades.

5. The artificial tree according to claim 1, wherein the artificial tree includes water receptors arranged in circular manner constituted by a circular opening on a lid of the water reserve cistern, near the peripheral edge, said water receptors being closed by specific overflow floats positioned inside the water reserve cisterns when the water reserve cisterns are full.

6. The artificial tree according to claim 1, wherein the photovoltaic members consist of an artificial plastic foliage lining and/or artificial foliage made of photovoltaic fabric.

7. The artificial tree according to claim 1, wherein the artificial tree has a vertical crown and the vertical crown is provided with photovoltaic surfaces.

8. The artificial tree according to claim 7, wherein said photovoltaic surfaces are made of artificial plastic foliage lining and/or artificial foliage made of photovoltaic fabric.

9. The artificial tree according to claim 1, wherein said electric generator contained in the box, has an inner crown, provided with a series of magnets equally distributed around an inner circumference, said inner crown is integral with a stator member of the electric generator; and wherein a coaxial coupling of a rotating crown with a stator crown forms a magnetic motor powered by repelling magnetic poles.

10. The artificial tree according to claim 1, wherein said rainwater can easily slide along the curved surfaces of each turbine blade and advantageously end up inside the cistern for collection and distribution.

11. The artificial tree according to claim 1, further comprising an anemometer superimposed over said integral hybrid energy generator.

12. The artificial tree according to claim 1, further comprising a water receptor fitted on the end of a tubular member by means of a bearing and wherein said water receptor has a photovoltaic cap attached.

13. The artificial tree according to claim 1, wherein said cistern 80 is cap-shaped with a curvilinear profile converging downward towards the center so as to allow the collected rainwater to be conveyed by gravity towards the water purifier and the water distribution pipes positioned at the central trunk.

14. The artificial tree according to claim 1, further comprising additional water receptors arranged on top of the cistern forming a rainwater collection ring.

15. The artificial tree according to claim 1, wherein said cistern 80 has its space delimited by stabilizing loops, made of galvanized iron, distributed with regular pitch on surfaces horizontal to the vertical central axis of the artificial tree and vertically connected by means of steel cables.

16. The artificial tree according to claim 1, wherein said hybrid energy generator generates electric power covering a range from a few kilowatts to half a megawatt, depending on the height of the tree itself.

17. The artificial tree according to claim 1, wherein said base structure further comprises shelves being fixed to radially protruding profiles attached to said vertically superimposed tubular members, wherein said shelves support an elevated structure comprising a water reserve cistern split into tanks defining a peripheral edge on top.

18. The artificial tree according to claim 1, further comprising LED illuminating members supplied by the electric generator of the artificial tree.

19. The artificial tree according to claim 1, wherein said cisterns and water pipes are designed for an accumulation, purification and distribution of rainwater; said rainwater is collected during rainfall and stored inside the cisterns, purified and then used for drinking by animals and humans, for hygienic use and for irrigation.

* * * * *